(12) United States Patent
Mueller

(10) Patent No.: US 11,757,259 B2
(45) Date of Patent: Sep. 12, 2023

(54) EDGE-EMITTING SEMICONDUCTOR LASER AND METHOD FOR PRODUCING AN EDGE-EMITTING SEMICONDUCTOR LASER

(71) Applicant: OSRAM Opto Semiconductors GmbH, Regensburg (DE)

(72) Inventor: Martin Mueller, Bernhardswald (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 25 days.

(21) Appl. No.: 17/637,223

(22) PCT Filed: Aug. 18, 2020

(86) PCT No.: PCT/EP2020/073098
§ 371 (c)(1),
(2) Date: Feb. 22, 2022

(87) PCT Pub. No.: WO2021/037607
PCT Pub. Date: Mar. 4, 2021

(65) Prior Publication Data
US 2022/0285919 A1 Sep. 8, 2022

(30) Foreign Application Priority Data
Aug. 26, 2019 (DE) ..................... 10 2019 212 746.0

(51) Int. Cl.
*H01S 5/00* (2006.01)
*H01S 5/40* (2006.01)
(Continued)

(52) U.S. Cl.
CPC ............ *H01S 5/4043* (2013.01); *H01S 5/125* (2013.01); *H01S 5/2036* (2013.01); *H01S 5/3095* (2013.01)

(58) Field of Classification Search
CPC ...... H01S 5/4043; H01S 5/125; H01S 5/2036; H01S 5/3095
See application file for complete search history.

(56) References Cited

U.S. PATENT DOCUMENTS

| 9,270,085 B1* | 2/2016 | Kanskar | ................ H01S 5/4062 |
| 2008/0123710 A1* | 5/2008 | Brick | ..................... B82Y 20/00 |
| | | | 372/50.1 |

(Continued)

FOREIGN PATENT DOCUMENTS

| DE | 102006061532 A1 | 4/2008 |
| DE | 102008040374 A1 | 1/2010 |

OTHER PUBLICATIONS

International Search Report (with English Translation) and Written Opinion in corresponding International Application No. PCT/EP2020/073098 dated Nov. 2, 2020, 16 pages.

*Primary Examiner* — Kinam Park
(74) *Attorney, Agent, or Firm* — MH2 TECHNOLOGY LAW GROUP LLP

(57) ABSTRACT

The invention relates to an edge-emitting semiconductor laser comprising —at least two laser diodes, each of which is designed to generate electromagnetic radiation, wherein —the laser diodes are arranged on top of one another in a vertical direction, —the laser diodes are monolithically connected to one another, and —at least one frequency-stabilizing element is arranged in an end region of the laser diodes. The invention also relates to a method for producing an edge-emitting semiconductor laser.

20 Claims, 2 Drawing Sheets

(51) Int. Cl.
   *H01S 5/125* (2006.01)
   *H01S 5/20* (2006.01)
   *H01S 5/30* (2006.01)

(56) References Cited

U.S. PATENT DOCUMENTS

| | | | |
|---|---|---|---|
| 2008/0291951 A1* | 11/2008 | Konttinen | H04N 9/3164 |
| | | | 372/21 |
| 2008/0304531 A1 | 12/2008 | Mansour et al. | |
| 2012/0250715 A1* | 10/2012 | Muller | H01S 5/4031 |
| | | | 372/45.01 |
| 2016/0322782 A1* | 11/2016 | Farrell | H01S 5/1003 |
| 2017/0170633 A1 | 6/2017 | Tsuji | |
| 2018/0212404 A1* | 7/2018 | Enzmann | H01S 5/0217 |

\* cited by examiner

EDGE-EMITTING SEMICONDUCTOR LASER AND METHOD FOR PRODUCING AN EDGE-EMITTING SEMICONDUCTOR LASER

CROSS-REFERENCE TO RELATED APPLICATIONS

This patent application is a national stage entry from International Application No. PCT/EP2020/073098, filed on Aug. 18, 2020, published as International Publication No. WO 2021/037607 A1 on Mar. 4, 2021, and claims priority under 35 U.S.C. § 119 from German patent application 10 2019 212 746.0, filed Aug. 26, 2019, the entire contents of all of which are incorporated by reference herein.

FIELD

An edge emitting semiconductor laser and a method for producing an edge emitting semiconductor laser are specified.

BACKGROUND

One object to be achieved consists in specifying an edge emitting semiconductor laser which is operable particularly stably. Moreover, the intention is to specify a method for producing such an edge emitting semiconductor laser.

SUMMARY

In accordance with at least one embodiment, the edge emitting semiconductor laser comprises at least two laser diodes, each of which is configured to generate electromagnetic radiation. The laser diodes are configured for example to generate near ultraviolet radiation, visible light and/or near infrared radiation during operation. The electromagnetic radiation generated during operation of the laser diodes is monochromatic and coherent laser light, for example.

By way of example, each laser diode comprises a semiconductor layer sequence. The semiconductor layer sequence is preferably based on a compound semiconductor material. By way of example, the semiconductor layer sequence is based on a III-V compound semiconductor material, such as a nitride compound semiconductor material, a phosphide compound semiconductor material or an arsenide compound semiconductor material. The semiconductor layer sequences can comprise dopants and additional constituents.

The laser diodes preferably extend along a main extension plane in a longitudinal direction. A lateral direction is for example parallel to the main extension plane and is perpendicular to the longitudinal direction. A vertical direction is arranged for example perpendicular to the main extension plane.

The semiconductor layer sequence of a laser diode comprises a first cladding layer and a second cladding layer, each of which extends in a longitudinal direction. Furthermore, the first cladding layer and the second cladding layer are arranged one above another in a vertical direction.

By way of example, each of the semiconductor layer sequences comprises an active zone arranged between the first cladding layer and the second cladding layer. The active zone comprises for example a pn junction, a double quantum well structure, a single quantum well structure or a multi quantum well structure for generating the electromagnetic radiation.

By way of example, it is possible for a laser diode to comprise at least two quantum well structures. In this case, the quantum well structures are configured to generate electromagnetic radiation having a mutually different peak wavelength. By way of example, the laser diode comprises a first quantum well structure, which generates electromagnetic radiation having a first peak wavelength. The first peak wavelength is 890 nm, for example. Furthermore, the laser diode can comprise a second quantum well structure, which generates electromagnetic radiation having a second peak wavelength. The second peak wavelength is 905 nm, for example.

Alternatively or additionally, it is possible for the at least two laser diodes to be configured to generate electromagnetic radiation having a mutually different peak wavelength. By way of example, one of the laser diodes can emit electromagnetic radiation having the first peak wavelength. Furthermore, the other of the laser diodes can emit electromagnetic radiation having the second peak wavelength.

It is furthermore possible for each of the laser diodes to generate electromagnetic radiation having a peak wavelength during operation. The peak wavelengths of the laser diodes are substantially identical, for example. Substantially identical means here that the peak wavelengths of the wavelength ranges of different laser diodes deviate from one another by at most 5 nanometers.

Moreover, a first propagation layer can be arranged between the active zone and the first cladding layer. A second propagation layer can be arranged between the active zone and the second cladding layer.

The radiation generated in the active zones forms in each case a beam having a beam profile having a lateral and a vertical extent in cross section perpendicular to the longitudinal direction. By way of example, the beam profile projects beyond the active zones in each case in a vertical direction. The cladding layers in this case have a lower refractive index for the radiation than the propagation layers. The vertical extents of a beam profile can be set by way of the choice of the refractive index of the propagation layers.

The laser diodes each comprise a facet, for example, through which electromagnetic radiation is able to be coupled out during operation of the laser diodes. The facets are formed in each case by a front side surface or at a front side surface in a start region of the laser diode, in particular of the semiconductor layer sequences. By way of example, the laser diodes have a common front side surface. In this case, the facets are arranged in a common plane. The common plane extends for example substantially perpendicular or perpendicular to the main extension plane. Substantially perpendicular means that the common plane forms an angle with the vertical direction that is less than 2°.

Furthermore, the laser diodes each comprise for example a resonator extending between the start region and an end region of a laser diode.

In accordance with at least one embodiment, the laser diodes are arranged one above another in a vertical direction. The laser diodes are arranged in a manner stacked one above another for example along a growth direction. By way of example, the laser diodes directly adjoin one another. The laser diodes are in particular electrically conductively connected to one another. It is possible for example for two directly adjacent laser diodes to be electrically conductively connected by a tunnel junction.

In accordance with at least one embodiment, the laser diodes are monolithically connected to one another. The semiconductor layer sequences of the laser diodes are for example epitaxially grown semiconductor layer sequences.

The laser diodes, in particular the semiconductor layers, are epitaxially grown one directly above another in a vertical direction.

In accordance with at least one embodiment, at least one frequency-stabilizing element is arranged in an end region of the laser diodes. The end region is arranged opposite the start region, for example. In this case, the frequency-stabilizing element is arranged opposite the facet. The resonator is then formed by a region between the facet and the frequency-stabilizing element. In this case, the resonator is delimited for example by the facet and by the frequency-stabilizing element along the longitudinal direction. In this embodiment, the active zone of the laser diodes extends in each case between the facet and the frequency-stabilizing element along the longitudinal direction.

The frequency-stabilizing element is configured for example as reflective for the electromagnetic radiation generated in the active zone. In particular, the frequency-stabilizing element is configured to reflect said electromagnetic radiation wavelength-selectively.

In at least one embodiment, the laser diodes are in each case broad-stripe laser diodes.

The active zones each have for example a length in a longitudinal direction that is at least 200 micrometers and at most 8000 micrometers. In particular, the active zones each have a length of at least 500 micrometers and at most 5000 micrometers.

Furthermore, the active zones each have for example a width that is at least 10 micrometers and at most 800 micrometers. In particular, the active zones each have a width of at least 100 micrometers and at most 200 micrometers. The width here corresponds to the minimum extent of the active zones in a lateral direction.

A thickness in a vertical direction of each laser diode is for example at least 1 micrometer and at most 10 micrometers. In particular, the active zones each have a thickness of at least 2 micrometers and at most 5 micrometers.

In at least one embodiment, the edge emitting semiconductor laser comprises at least two laser diodes, each of which is configured to generate electromagnetic radiation. The laser diodes are arranged one above another in a vertical direction, the laser diodes are monolithically connected to one another, and at least one frequency-stabilizing element is arranged in an end region of the laser diodes.

One concept of the edge emitting semiconductor laser described here is, inter alia, the use of an edge emitting semiconductor laser comprising at least two laser diodes stacked one above another in conjunction with a frequency-stabilizing element.

A wavelength of a semiconductor laser is typically dependent on the ambient temperature and/or the operating temperature. A temperature coefficient of a wavelength is approximately 0.3 nm/K, in particular approximately 0.27 nm/K, for a semiconductor laser having an emission wavelength of approximately 900 nanometers without a frequency-stabilizing element. In contrast thereto, the frequency-stabilizing element has a temperature coefficient that is less than the temperature coefficient of the semiconductor laser without a frequency-stabilizing element approximately by the factor of 4. A semiconductor laser with a frequency-stabilizing element can thus emit electromagnetic radiation in a wavelength range, wherein the wavelength range is particularly stable to withstand temperature fluctuations. In particular, such semiconductor lasers are advantageously usable in motor vehicles.

Furthermore, components comprising a semiconductor laser have for example a filter that absorbs for example extraneous light radiated onto the semiconductor laser from an external environment. The greater the temperature coefficient, the greater a transmissive wavelength range of the filter must be. The greater the transmissive wavelength range of the filter, however, the lower a signal-to-noise ratio of the semiconductor laser. As a result of the use of the frequency-stabilizing element, the emitted wavelength range is particularly stable to withstand temperature fluctuations and the transmissive wavelength range of the filter can correspond to the wavelength range emitted by the semiconductor laser. Such a semiconductor laser with possible surrounding components can thus advantageously have a particularly high signal-to-noise ratio.

In accordance with at least one embodiment, a single frequency-stabilizing element is assigned to all the laser diodes. That is to say that the semiconductor laser then comprises exactly one frequency-stabilizing element. In this embodiment, each resonator is delimited by the frequency-stabilizing element. In particular, the resonators are delimited by the same frequency-stabilizing element. That is to say that the frequency-stabilizing element here is embodied for example integrally along the laser diodes. Advantageously, such a frequency-stabilizing element is producible in a single production step.

In accordance with at least one embodiment, a common frequency-stabilizing element is assigned to at least two laser diodes. By way of example, the at least two laser diodes share the common frequency-stabilizing element.

Alternatively, it is possible for at least two frequency-stabilizing elements to form the common frequency-stabilizing element. In this case, the frequency-stabilizing elements can be producible in separate production steps. In particular, the frequency-stabilizing elements can then be arranged one above another and completely overlap in longitudinal and lateral directions in plan view.

In accordance with at least one embodiment, a frequency-stabilizing element is assigned one-to-one to each laser diode.

That is to say that a single frequency-stabilizing element is assigned to each laser diode. Each resonator is delimited for example by a respective frequency-stabilizing element. That is to say that the semiconductor laser comprises equal numbers of laser diodes and frequency-stabilizing elements.

In accordance with at least one embodiment, the semiconductor laser comprises at least two frequency-stabilizing elements, and the frequency-stabilizing elements are arranged offset with respect to one another in longitudinal directions in plan view. The frequency-stabilizing elements are embodied so as to be free of overlap for example in a longitudinal direction in plan view. That is to say that the frequency-stabilizing elements are arranged at a distance from one another in a longitudinal direction. In this embodiment, for example, each of the frequency-stabilizing elements is freely accessible from outside.

Since the frequency-stabilizing elements are each freely accessible from outside, it is possible to produce the frequency-stabilizing elements in the material of the laser diodes in a particularly simple manner.

The resonators of the laser diodes are embodied with different lengths, for example. A length of a resonator is formed by an extent in a longitudinal direction between a front side of a laser diode and a part of the assigned frequency-stabilizing element. By way of example, the lengths of the resonators differ by a multiple of $\lambda_0/(2*n_{\textit{eff}})$. Here $\lambda_0$ corresponds to a peak wavelength of the electromagnetic radiation in air and $n_{\textit{eff}}$ is an effective refractive index of the semiconductor layer sequence in the region of the resonator and in the end region.

In accordance with at least one embodiment, the edge emitting semiconductor laser comprises at least three laser diodes. The at least three laser diodes are arranged in a manner stacked one above another for example in a vertical direction. In particular, the at least three laser diodes are monolithically connected to one another.

In accordance with at least one embodiment, a first frequency-stabilizing element is assigned to at least two first laser diodes. In this embodiment, the at least two first laser diodes are directly adjacent laser diodes. The first frequency-stabilizing element is a common frequency-stabilizing element of the at least two first laser diodes. That is to say that the resonators of the at least two first laser diodes are delimited by the same frequency-stabilizing element.

In accordance with at least one embodiment, a second frequency-stabilizing element is assigned to at least one second laser diode. In this embodiment, the resonator of the at least one second laser diode is delimited by the second frequency-stabilizing element. In other words, the semiconductor laser then comprises at least two frequency-stabilizing elements, namely the first frequency-stabilizing element and the second frequency-stabilizing element.

In accordance with at least one embodiment, the second frequency-stabilizing element is arranged offset with respect to the first frequency-stabilizing element in a longitudinal direction in plan view. The first frequency-stabilizing element is embodied in a manner free of overlap with respect to the second frequency-stabilizing element for example in a longitudinal direction in plan view. In this embodiment, the first frequency-stabilizing element and the second frequency-stabilizing element are freely accessible from outside.

In accordance with at least one embodiment, the edge emitting semiconductor laser comprises at least four laser diodes. The at least four laser diodes are arranged in a manner stacked one above another for example in a vertical direction. In particular, the at least four laser diodes are monolithically connected to one another.

In accordance with at least one embodiment, a first frequency-stabilizing element is assigned to at least two first laser diodes of the at least four laser diodes.

In accordance with at least one embodiment, a second frequency-stabilizing element is assigned to at least two second laser diodes of the at least four laser diodes. In this embodiment, the at least two second laser diodes are directly adjacent laser diodes. The second frequency-stabilizing element is for example a common frequency-stabilizing element. Furthermore, the second frequency-stabilizing element can be a common frequency-stabilizing element assigned to the at least two second laser diodes. That is to say that the resonators of the at least two second laser diodes are delimited by the same second frequency-stabilizing element.

In accordance with at least one embodiment, the second frequency-stabilizing element is arranged offset with respect to the first frequency-stabilizing elements in a longitudinal direction in plan view.

In accordance with at least one embodiment, at least one of the frequency-stabilizing elements comprises cutouts in the material of at least one laser diode. If a frequency-stabilizing element is assigned to all the laser diodes, then the cutouts penetrate through all the semiconductor layer sequences in a vertical direction, in particular completely. In particular, the cutouts completely perforate all the active zones.

If a frequency-stabilizing element is assigned one-to-one to each laser diode, then each frequency-stabilizing element respectively comprises the cutouts. In this case, the cutouts of a frequency-stabilizing element penetrate through a one-to-one assigned semiconductor layer sequence in a vertical direction, in particular completely. In particular, the cutouts of a frequency-stabilizing element completely perforate a one-to-one assigned active zone.

Alternatively, it is possible for the cutouts of a frequency-stabilizing element to partly penetrate through a one-to-one assigned semiconductor layer sequence in a vertical direction. In particular, the cutouts of a frequency-stabilizing element do not perforate a one-to-one assigned active zone in this case. By way of example, the cutouts of a frequency-stabilizing element completely penetrate through the second cladding layer and partly penetrate through the second propagation layer.

The cutouts extend for example perpendicular to the longitudinal direction. Furthermore, the cutouts are arranged for example along the longitudinal direction. The cutouts are at a distance from one another of $\lambda_0/(2*n_{eff})$, for example. Alternatively, it is possible for the cutouts to be at a distance from one another which corresponds to a multiple of $\lambda_0/(2*n_{eff})$.

If the cutouts are at a distance of $\lambda_0/(2*n_{eff})$, it is possible to generate a single longitudinal mode of the electromagnetic radiation.

If the distance between the cutouts comprises a multiple of $\lambda_0/(2*n_{eff})$, advantageously a plurality of longitudinal modes can be reflected, which are able to be coupled out via the assigned facet. In particular, it is possible to reflect electromagnetic radiation having a peak wavelength that is less than the distance between the cutouts. Advantageously, the distances are thus able to be chosen to be particularly large, such that a production process is particularly simple.

In accordance with at least one embodiment, the cutouts are filled with a gas. The material of the gas has for example a refractive index of at most 1.1. The gas can for example be air or a process gas such as, for example, argon, krypton, xenon, nitrogen or oxygen and contain traces of other gases.

The gas preferably directly adjoins the material of the laser diode, which material has for example a refractive index of at least 2. Such a difference in refractive index between the material of the laser diode and the gas advantageously brings about a particularly high reflectivity for the electromagnetic radiation generated.

In accordance with at least one embodiment, the cutouts each have a width of at least 40 nanometers and at most 4000 nanometers. The width is for example the distance between two mutually opposite inner surfaces of a cutout along the longitudinal direction, at the level of the active zone. In particular, the width of the cutouts is in each case at least 60 nanometers and at most 1000 nanometers. By way of example, the material of the laser diode which is arranged between two cutouts has a smaller width than the cutouts.

In accordance with at least one embodiment, at least one of the frequency-stabilizing elements is a Bragg mirror. In particular, the Bragg mirror is a Bragg grating. Advantageously, electromagnetic radiation is wavelength-selectively reflectable particularly well by the Bragg mirror, in particular the Bragg grating.

In accordance with at least one embodiment, the laser diodes are arranged in a manner stacked one above another on a substrate. The substrate is for example a growth substrate of the laser diodes. Alternatively, the substrate can be different than a growth substrate.

In accordance with at least one embodiment, a contact layer is arranged on the laser diodes. The contact layer is arranged for example on the outermost laser diode. The contact layer is for example in direct contact with the outermost laser diode. The contact layer is for example configured in electrically conductive fashion and configured for electrically contacting the outermost laser diode. The contact layer comprises or consists of a metal, for example.

In accordance with at least one embodiment, a counter-contact layer is arranged on the substrate. By way of example, the counter-contact layer is arranged on a side facing away from the laser diodes.

In accordance with at least one embodiment, the contact layer is arranged in a manner free of overlap with the frequency-stabilizing elements in a longitudinal direction in plan view. In this case, the contact layer is embodied in a manner free of overlap with respect to the frequency-stabilizing element of the outermost laser diode. In this case, the contact layer overlaps, in particular completely, the resonator arranged underneath.

Alternatively, it is possible for the contact layer to completely overlap the frequency-stabilizing elements in plan view. Thus, the active zone can be energized in the end region as well and losses can be reduced.

Furthermore, a method for producing an edge emitting semiconductor laser is specified, by means of which in particular an edge emitting semiconductor laser described here can be produced. Therefore, all features and embodiments disclosed in association with the edge emitting semiconductor laser are also disclosed in association with the method, and vice versa.

In accordance with at least one embodiment of the method, at least two laser diodes are provided. The laser diodes are produced one above another for example by an epitaxial growth process, in such a way that the laser diodes are monolithically connected to one another.

In accordance with at least one embodiment of the method, the laser diodes are applied in a manner stacked one above another in a vertical direction. By way of example, after having been applied the laser diodes have the same dimensions in a longitudinal direction. In particular, it is possible for the laser diodes to be embodied congruently in plan view.

In accordance with at least one embodiment of the method, the laser diodes are monolithically connected to one another.

In accordance with at least one embodiment, the laser diodes have a common planar front side surface.

In accordance with at least one embodiment of the method, at least one frequency-stabilizing element is produced in an end region of the laser diodes. The cutouts are produced for example by material ablation of the material of at least one laser diode. The material ablation is produced for example by means of a wet-chemical or dry-chemical etching process.

In accordance with at least one embodiment of the method, after providing the laser diodes, material of at least one laser diode is removed regionally, in such a way that a laser diode arranged underneath is exposed regionally. By way of example, the laser diode arranged underneath is exposed in the end region. In this case, the laser diodes have a stepped profile in the end regions. By way of example, a top surface and a rear side surface opposite the front side surface of the laser diode which is removed regionally and an exposed top surface of the laser diode arranged underneath form a stepped profile.

The material of the at least one laser diode which is removed regionally is removed by means of material ablation, for example. The material ablation is effected for example by means of a wet-chemical or dry-chemical etching process.

Advantageously, it is thus possible to produce the frequency-stabilizing element in such exposed material of the laser diode in a particularly simple manner.

In accordance with at least one embodiment of the method, a frequency-stabilizing element is produced in the exposed laser diodes in each case in an end region. By way of example, the frequency-stabilizing elements are formed by the cutouts.

The edge emitting semiconductor laser and the method for producing an edge emitting semiconductor laser are explained in greater detail below on the basis of exemplary embodiments and with reference to the associated figures.

DETAILED DESCRIPTION

Elements that are identical, of identical type or act identically are provided with the same reference signs in the figures. The figures and the size relationships of the elements illustrated in the figures among one another should not be regarded as to scale. Rather, individual elements may be illustrated with an exaggerated size in order to enable better illustration and/or in order to afford a better understanding.

Figure 1:
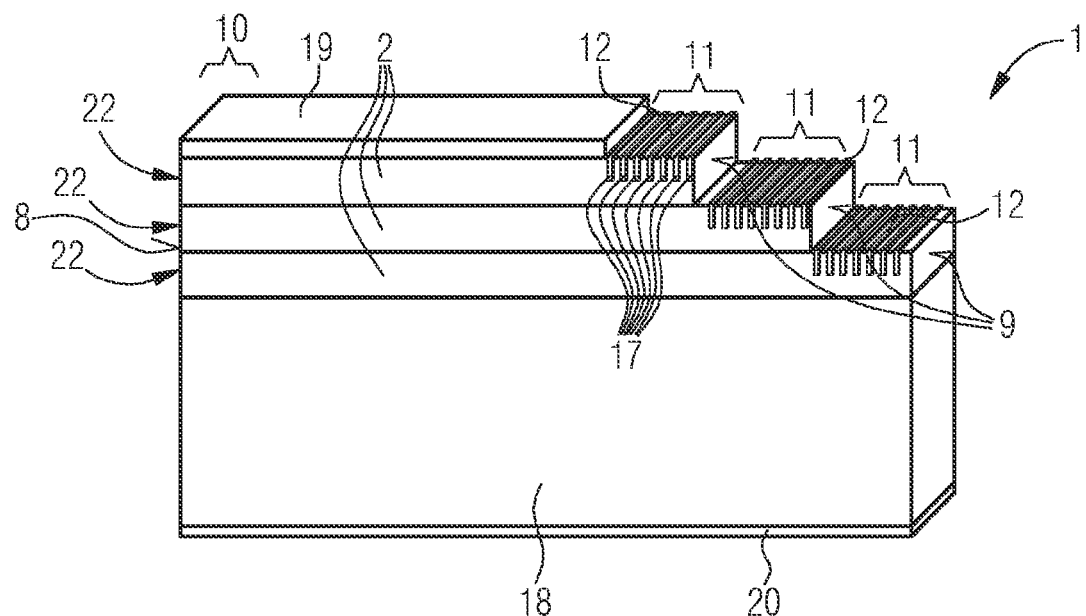
FIG. 1 shows a schematic illustration of an edge emitting semiconductor laser in accordance with one exemplary embodiment.

FIG. 1 shows a schematic illustration of one exemplary embodiment of an edge emitting semiconductor laser 1 described here. The semiconductor laser 1 comprises three laser diodes 2 arranged on a substrate 18. The laser diodes are arranged one above another in a vertical direction, corresponding in particular to a growth direction of the laser diodes 2. In this exemplary embodiment, the laser diodes 2 are grown epitaxially one on top of another. That is to say that the laser diodes 2 are monolithically connected to one another.

Each laser diode 2 comprises a facet 22, through which electromagnetic radiation is able to be coupled out during operation of the laser diodes 2. The facets 22 here are arranged in each case at a front side surface 8 in a start region 10 of the laser diode 2. In this exemplary embodiment, the facets 22 are arranged in a common plane. That is to say that the front side surface 8 is a common planar surface. This surface extends for example substantially perpendicular to a main extension plane of the laser diodes 2.

The laser diodes 2 here are electrically conductively connected. In this case, all the laser diodes 2 are able to be energized via a contact layer 19 and a counter-contact layer 20. The contact layer 19 is arranged on an outermost laser diode 2 facing away from the substrate 18. The counter-contact layer 20 is arranged on a side of the substrate 18 facing away from the laser diodes 1. For the case where the substrate 18 is removed, the counter-contact layer 20 can also directly adjoin the side of the laser diodes 2 facing away from the contact layer 19.

Furthermore, a frequency-stabilizing element 12 is assigned to each laser diode 2 in an end region 11 of the laser diodes 2. The end regions 11 are each arranged opposite the start region 10.

The frequency-stabilizing elements 12 each comprise cutouts 17 in the material of the laser diodes 2. In this case, the cutouts 17 of a frequency-stabilizing element 12 penetrate through a one-to-one assigned laser diode 2 in a vertical direction. The cutouts extend perpendicular to the longitudinal direction of the laser diodes 2. Furthermore, the cutouts 17 are arranged along the longitudinal direction.

Furthermore, the frequency-stabilizing elements 12 are each arranged opposite the assigned facet 22. A frequency-stabilizing element 12 and the assigned facet 22 thus delimit a resonator of a laser diode 2.

In this exemplary embodiment, the frequency-stabilizing elements 12 are arranged offset with respect to one another in a longitudinal direction in plan view. That is to say that the frequency-stabilizing elements 12 are embodied in a manner free of overlap in a longitudinal direction in plan view. In this case, the end regions 11 of the laser diodes are also embodied in a manner free of overlap in a longitudinal direction in plan view. As a result of such an arrangement, the outer surfaces of the frequency-stabilizing elements 12 facing away from the substrate are freely accessible in each case.

The freely accessible frequency-stabilizing elements 12 are not covered by the contact layer 19 either. In this case, the contact layer 19 is arranged in a manner free of overlap with the frequency-stabilizing elements 12 and the end regions 11 in a longitudinal direction in plan view.

Figure 2:
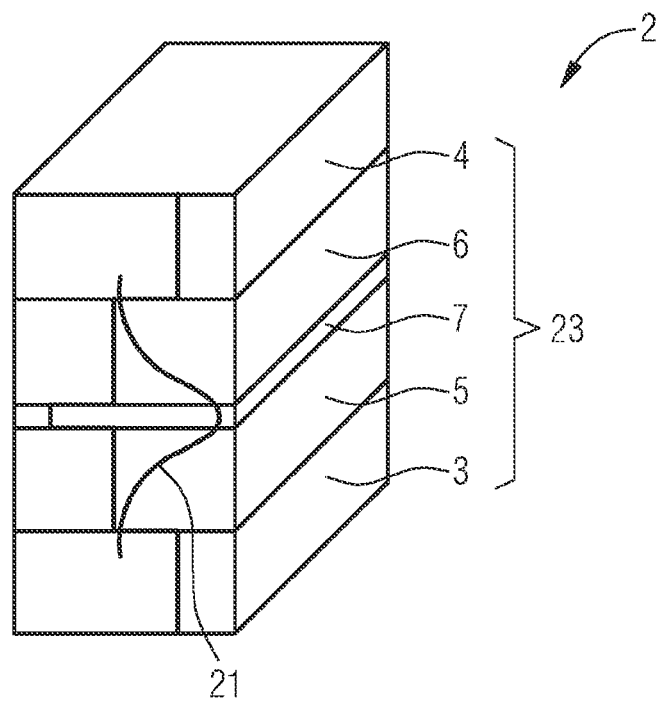
FIG. 2 shows an exemplary schematic illustration of an excerpt from a laser diode.

FIG. 2 illustrates an excerpt from a laser diode 2 in accordance with the exemplary embodiment in FIG. 1. Each laser diode 2 comprises a semiconductor layer sequence 23. The semiconductor layer sequences 23 each comprise a first cladding layer 3 and a second cladding layer 4, which each extend in a longitudinal direction. Furthermore, the first cladding layer 3 and the second cladding layer 4 are arranged one above the other in a vertical direction.

Furthermore, a first propagation layer 5 and a second propagation layer 6 are arranged between the first cladding layer 3 and the second cladding layer 4. An active zone 7 is furthermore arranged between the first propagation layer 5 and the second propagation layer 6. In particular, the semiconductor layer sequence 23 has the following layer order: first cladding layer 3, first propagation layer 5, active zone 7, second propagation layer 6 and second cladding layer 4. Directly adjacent elements can in particular be in direct contact with one another.

Furthermore, a beam profile 21 of the electromagnetic radiation generated is illustrated for the active zone. The beam profile has a lateral and a vertical extent in cross section perpendicular to the longitudinal direction. By way of example, the beam profile 21 projects beyond the active zone 7, the first propagation layer 5 and the second propagation layer 6 in a vertical direction. Furthermore, it is possible for the beam profile 21 to decay exponentially in the first cladding layer 3 and the second cladding layer 4.

Figure 3:
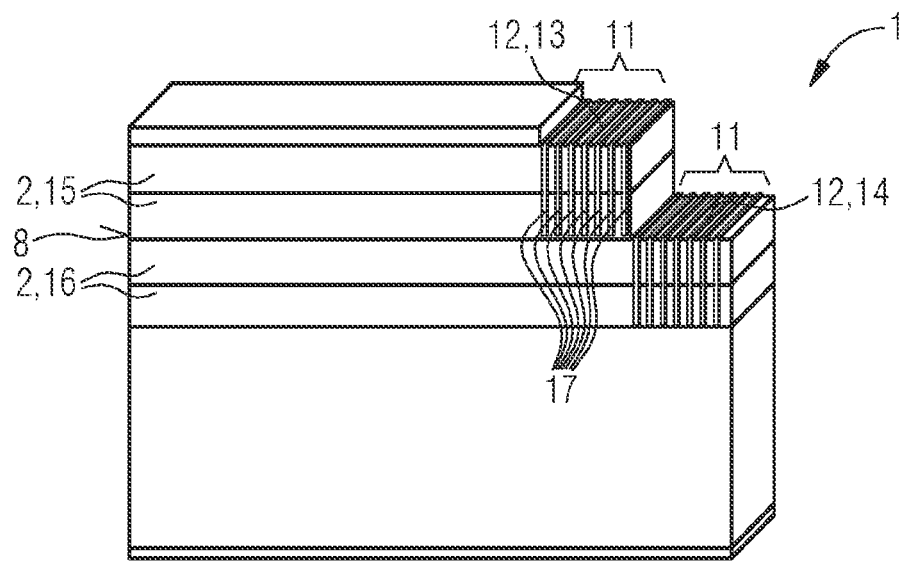
FIGS. 3 and 4 show schematic illustrations of an edge emitting semiconductor laser in accordance with a respective exemplary embodiment.

In contrast to the exemplary embodiment in FIG. 1, the exemplary embodiment in FIG. 3 shows an edge emitting semiconductor laser 1 comprising two first laser diodes 15 and two second laser diodes 16. The four laser diodes 2 are arranged in a manner stacked one above another in a vertical direction. Furthermore, the four laser diodes 2 are monolithically connected to one another. In this exemplary embodiment, the at least two first laser diodes 15 are directly adjacent laser diodes 2. The two second laser diodes 16 are likewise directly adjacent.

A first frequency-stabilizing element 13 is assigned to the two first laser diodes 15. A second frequency-stabilizing element 14 is assigned to the two second laser diodes 16. The first frequency-stabilizing element 13 is a common frequency-stabilizing element 12 of the two first laser diodes 15. Furthermore, the second frequency-stabilizing element 14 is a common frequency-stabilizing element 12 of the two second laser diodes 16.

In this exemplary embodiment, cutouts 17 of the two first laser diodes 15 both penetrate through the two first laser diodes 15, in particular both active regions 7 of the two first laser diodes 15. Furthermore, it is possible for the cutouts 17 of the two first laser diodes 15 to completely perforate the first propagation layers 5, the active zones 7 and the second propagation layers 6 of the two first laser diodes 15.

The cutouts 17 of the two second laser diodes 16 penetrate through the two second laser diodes 16, in particular both active regions 7 of the two first laser diodes 16. Furthermore, it is possible for the cutouts 17 of the two second laser diodes 16 to completely perforate the first propagation layers 5, the active zones 7 and the second propagation layers 6 of the two second laser diodes 16.

The second frequency-stabilizing element 14 here is arranged offset with respect to the first frequency-stabilizing element 13 in a longitudinal direction in plan view. That is to say that the first frequency-stabilizing element 13 is embodied in a manner free of overlap with respect to the second frequency-stabilizing element 14 in a longitudinal direction in plan view. Furthermore, the first frequency-stabilizing element 13 and the second frequency-stabilizing element 14 are freely accessible from outside.

Figure 4:
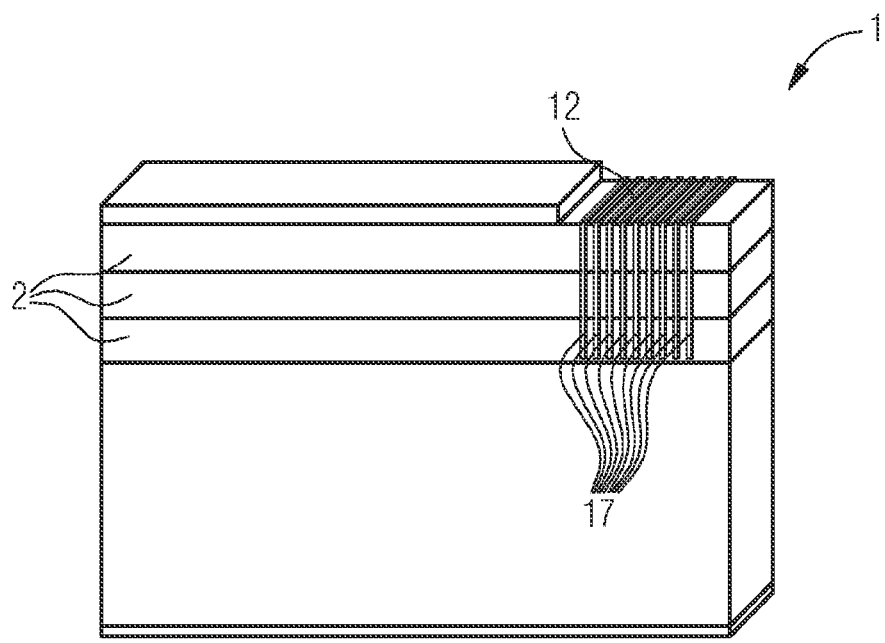

In contrast to the exemplary embodiment in FIG. 1, the exemplary embodiment in FIG. 4 shows an edge emitting semiconductor laser 1 comprising three laser diodes 2 and a single frequency-stabilizing element 12. In this exemplary embodiment, each resonator is delimited by the single frequency-stabilizing element 12.

The cutouts 17 of the laser diodes 2 penetrate through the semiconductor layers of the laser diodes 2. In particular, the cutouts 17 completely penetrate through the first propagation layers 5, the active zones 7 and the second propagation layers 6 of each laser diode 2.

The features and exemplary embodiments described in association with the figures can be combined with one another in accordance with further exemplary embodiments, even if not all of the combinations are explicitly described. Furthermore, the exemplary embodiments described in association with the figures can alternatively or additionally have further features in accordance with the description in the general part.

The invention is not restricted to the exemplary embodiments by the description on the basis thereof. Rather, the invention encompasses any novel feature and also any combination of features, which in particular includes any combination of features in the patent claims, even if this feature or this combination itself is not explicitly explained in the patent claims or exemplary embodiments.

The invetion claimed is:

1. An edge emitting semiconductor laser comprising first and second laser diodes, each of which is configured to generate electromagnetic radiation, wherein
the first and second laser diodes are arranged one above another in a vertical direction, the first and second laser diodes are monolithically connected to one another,
one or a plurality of frequency-stabilizing element are arranged in an end region of the first and second laser diodes, wherein the second laser diode regionally is not covered by the first laser diode arranged above the second laser diode in a vertical direction and has one of the frequency-stabilizing elements in the uncovered region, and
at least one of the first and second laser diodes comprises:
first and second cladding layers,
first and second propagation layers positioned between the first and second cladding layers, wherein vertical extents of a beam profile are based upon a refractive index of the first and second propagation layers, and
an active zone positioned between the first and second propagation layers.

2. The edge emitting semiconductor laser as claimed in claim 1, where a single frequency-stabilizing element is assigned to the first and second laser diodes.

3. The edge emitting semiconductor laser as claimed in claim 1, wherein a common frequency-stabilizing element is assigned to the first and second laser diodes.

4. The edge emitting semiconductor laser as claimed in claim 1, wherein a frequency-stabilizing element is assigned one-to-one to the first and second laser diodes.

5. The edge emitting semiconductor laser as claimed in claim 4, wherein the frequency-stabilizing elements are arranged offset with respect to one another in a longitudinal direction in plan view.

6. The edge emitting semiconductor laser as claimed in claim 1, diodes further comprising a third laser diode, wherein
a first frequency-stabilizing element is assigned to the first and second laser diodes, and
a second frequency-stabilizing element is assigned to at least one further second the third laser diode, and
the second frequency-stabilizing element is arranged offset with respect to the first frequency-stabilizing elements in a longitudinal direction in plan view.

7. The edge emitting semiconductor laser as claimed in claim 6, further comprising a third laser diode and a fourth laser diode, wherein
a first frequency-stabilizing element is assigned to the first and second laser diodes, and
a second frequency-stabilizing element is assigned to the third and fourth laser diodes, and
the second frequency-stabilizing element is arranged offset with respect to the first frequency-stabilizing elements in a longitudinal direction in plan view.

8. The edge emitting semiconductor laser as claimed in claim 1,
wherein at least one of the frequency-stabilizing elements comprises cutouts in the material of the first laser diode, the second laser diode, or both.

9. The edge emitting semiconductor laser as claimed in claim 8, wherein the cutouts are filled with a gas.

10. The edge emitting semiconductor laser as claimed in claim 8,
wherein the cutouts each have a width of at least 40 nanometers and at most 4000 nanometers.

11. The edge emitting semiconductor laser as claimed in claim 1, wherein at least one of the frequency-stabilizing elements is a Bragg mirror.

12. The edge emitting semiconductor laser as claimed in claim 1, wherein the first and second laser diodes are arranged in a manner stacked one above another on a substrate,
a contact layer is arranged on the first and second laser diodes,
a counter-contact layer is arranged on the substrate, and
the contact layer is arranged in a manner free of overlap with the frequency-stabilizing elements in a longitudinal direction in plan view.

13. A method for producing an edge emitting semiconductor laser comprising:
providing first and second laser diodes, wherein
the first and second laser diodes are applied in a manner stacked one above another in a vertical direction,
the first and second laser diodes are monolithically connected to one another,
the first and second laser diodes have a common planar front side surface, and
at least one of the first and second laser diodes comprises:
first and second cladding layers,
first and second propagation layers positioned between the first and second cladding layers, wherein vertical extents of a beam profile are based upon a refractive index of the first and second propagation layers, and
an active zone positioned between the first and second propagation layers,
regionally removing material of the first laser diode after providing the first and second laser diodes in such a way that the second laser diode, which is arranged underneath the first laser diode, is regionally exposed, and
producing one or a plurality of frequency-stabilizing element in an end region of the first and second laser diodes, wherein one of the frequency-stabilizing elements is produced in the exposed region of the regionally exposed portion of the second laser diode.

14. The method as claimed in claim 13,
wherein after providing the first and second laser diodes, material of the first laser diode is removed regionally, in such a way that the second laser diode arranged underneath is exposed regionally.

15. The method as claimed in claim 14,
wherein, in the exposed portion of the second laser diode, a frequency-stabilizing element is produced in each case in an end region.

16. The method as claimed in claim 13,
wherein an edge emitting semiconductor laser is produced comprising
the first and second laser diodes, each of which is configured to generate electromagnetic radiation, wherein
the first and second laser diodes are arranged one above another in a vertical direction,
the first and second laser diodes are monolithically connected to one another, and
one or a plurality of frequency-stabilizing element are arranged in an end region of the first and second laser diodes, wherein the second laser diode regionally is not covered by the first laser diode arranged above the second laser diode in a vertical direction and has one of the frequency-stabilizing elements in the uncovered region.

17. The edge emitting semiconductor laser as claimed in claim 1, wherein the first laser diode comprises:

a first quantum well structure configured to generate the electromagnetic radiation having a first peak wavelength, and a second quantum well structure configured to generate the electromagnetic radiation having a second peak wavelength, wherein the first peak wavelength is greater than the second peak wavelength.

18. The edge emitting semiconductor laser as claimed in claim 1, wherein a temperature coefficient of a wavelength of the electromagnetic radiation is less than about 0.10 nm/K due at least partially to the one or the plurality of frequency-stabilizing element.

19. The edge emitting semiconductor laser as claimed in claim 1, wherein at least one of the frequency-stabilizing elements comprises cutouts, and wherein a distance between the cutouts causes the electromagnetic radiation having a peak wavelength that is less than the distance to be reflected.

20. The edge emitting semiconductor laser as claimed in claim 19, wherein the cutouts are filled with gas having a refractive index that is less than or equal to 1.1, and wherein the refractive index of the first laser diode, the second laser diode, or both is greater than or equal to 2.

* * * * *

UNITED STATES PATENT AND TRADEMARK OFFICE
CERTIFICATE OF CORRECTION

| | |
|---|---|
| PATENT NO. | : 11,757,259 B2 |
| APPLICATION NO. | : 17/637223 |
| DATED | : September 12, 2023 |
| INVENTOR(S) | : Martin Mueller |

It is certified that error appears in the above-identified patent and that said Letters Patent is hereby corrected as shown below:

In the Claims

At Column 11, Claim 6, Lines 32-41, should be --The edge emitting semiconductor laser as claimed in claim 1, further comprising a third laser diode, wherein a first frequency-stabilizing element is assigned to the first and second laser diodes, and a second frequency-stabilizing element is assigned to the third laser diode, and the second frequency-stabilizing element is arranged offset with respect to the first frequency-stabilizing elements in a longitudinal direction in plan view--.

Signed and Sealed this
Second Day of April, 2024

Katherine Kelly Vidal
*Director of the United States Patent and Trademark Office*